United States Patent
Boyl-Davis et al.

(10) Patent No.: US 9,429,935 B2
(45) Date of Patent: Aug. 30, 2016

(54) METHODS OF FABRICATING SHIMS FOR JOINING PARTS

(71) Applicant: The Boeing Company, Chicago, IL (US)

(72) Inventors: Theodore M. Boyl-Davis, Snohomish, WA (US); Darrell D. Jones, Mill Creek, WA (US); Tracy E. Zimmerman, Renton, WA (US)

(73) Assignee: THE BOEING COMPANY, Chicago, IL (US)

( * ) Notice: Subject to any disclaimer, the term of this patent is extended or adjusted under 35 U.S.C. 154(b) by 338 days.

(21) Appl. No.: 14/312,174

(22) Filed: Jun. 23, 2014

(65) Prior Publication Data

US 2014/0303764 A1 Oct. 9, 2014

Related U.S. Application Data

(63) Continuation of application No. 13/156,101, filed on Jun. 8, 2011, now Pat. No. 8,756,792.

(51) Int. Cl.
*G05B 19/4099* (2006.01)
*G06F 17/50* (2006.01)
*G05B 19/4093* (2006.01)

(52) U.S. Cl.
CPC ..... *G05B 19/4099* (2013.01); *G05B 19/40931* (2013.01); *G06F 17/50* (2013.01); *G06F 17/5095* (2013.01); *Y02P 90/265* (2015.11); *Y10T 29/49* (2015.01); *Y10T 29/49256* (2015.01); *Y10T 403/32737* (2015.01); *Y10T 403/7011* (2015.01)

(58) Field of Classification Search
CPC ..... G05B 19/4099; G05B 19/40931; G06F 17/50; G06F 17/5095; Y02P 90/265; Y10T 403/32737; Y10T 29/49; Y10T 29/49256; Y10T 403/7011
See application file for complete search history.

(56) References Cited

U.S. PATENT DOCUMENTS

| | | | |
|---|---|---|---|
| 4,488,137 A | 12/1984 | Rooney et al. | |
| 4,848,137 A | 7/1989 | Turner et al. | |
| 4,945,488 A * | 7/1990 | Carver | B29C 67/0074 700/182 |

(Continued)

OTHER PUBLICATIONS

Canadian Patent Office, "Examiner's Report," issued in connection with Canadian Patent Application No. 2,774,009, issued on May 9, 2016, 4 pages.

(Continued)

*Primary Examiner* — Ramesh Patel
(74) *Attorney, Agent, or Firm* — Hanley, Flight & Zimmerman, LLC

(57) ABSTRACT

Methods of fabricating shims for joining parts are disclosed. An example method of fabricating shims for joining parts, wherein the parts having mating surfaces separated by a gap, includes: generating first digital data representing a first surface profile of a first part; generating second digital data representing a second surface profile of a second part to mate with the first part; determining distances between the first and second parts, as assembled, at multiple locations; generating a digital volume that closely matches a gap between the first and second parts based on the determined distances; generating a three dimensional digital representation of a shim to fill the gap using the first and second digital data; and automatically fabricating the shim matching the gap using a computer-controlled machine, the machine being controlled using the three dimensional digital representation of the shim.

20 Claims, 7 Drawing Sheets

(56) References Cited

U.S. PATENT DOCUMENTS

| | | | |
|---|---|---|---|
| 4,979,815 A * | 12/1990 | Tsikos | G06K 9/209 356/2 |
| 5,106,290 A | 4/1992 | Carver et al. | |
| 5,385,050 A * | 1/1995 | Roberts | G01B 17/00 33/783 |
| 6,618,505 B2 | 9/2003 | Cork et al. | |
| 6,811,733 B2 | 11/2004 | Nelson et al. | |
| 7,487,901 B2 | 2/2009 | Talwar et al. | |
| 7,554,771 B2 * | 6/2009 | Hanrahan | F16C 27/00 360/265.2 |
| 7,565,206 B2 | 7/2009 | Palti | |
| 7,621,701 B2 | 11/2009 | Skiles et al. | |
| 7,730,789 B2 | 6/2010 | Odendahl | |
| 7,756,321 B2 * | 7/2010 | Marsh | B64F 5/0009 356/394 |
| 7,974,722 B2 | 7/2011 | Boyl-Davis et al. | |
| 8,272,118 B2 * | 9/2012 | Alvez | B21J 15/14 29/464 |
| 8,479,394 B2 * | 7/2013 | Glazebrook | B23P 19/10 29/897.2 |
| 8,655,480 B1 * | 2/2014 | Odendahl | B24B 19/22 451/259 |
| 8,756,792 B2 | 6/2014 | Boyl-Davis et al. | |
| 8,813,382 B1 * | 8/2014 | Buttrick | G01B 7/287 33/563 |
| 2001/0046323 A1 | 11/2001 | Cork et al. | |
| 2005/0100263 A1 * | 5/2005 | Shi | G02F 1/093 385/11 |
| 2006/0027630 A1 | 2/2006 | Talwar et al. | |
| 2006/0269368 A1 | 11/2006 | Skiles et al. | |
| 2007/0265727 A1 * | 11/2007 | Bae | G06F 17/50 700/182 |
| 2008/0110275 A1 * | 5/2008 | Odendahl | G01B 7/14 73/780 |
| 2008/0205763 A1 * | 8/2008 | Marsh | B64F 5/0009 382/190 |
| 2008/0223985 A1 | 9/2008 | Marsh et al. | |
| 2008/0256788 A1 * | 10/2008 | Glazebrook | B23P 19/10 29/700 |
| 2010/0102482 A1 | 4/2010 | Jones et al. | |
| 2011/0087358 A1 | 4/2011 | Boyl-Davis et al. | |

OTHER PUBLICATIONS

United States Patent and Trademark Office, "Requirement for Restriction/Election," issued in connection with U.S. Appl. No. 13/156,101, Jul. 25, 2013, 13 pages.

United States Patent and Trademark Office, "Non-Final Office Action," issued in connection with U.S. Appl. No. 13/156,101, Sep. 11, 2013, 45 pages.

United States Patent and Trademark Office, "Notice of Allowance and Fee(s) Due," issued in connection with U.S. Appl. No. 13/156,101, Feb. 11, 2014, 38 pages.

Canadian Intellectual Property Office, "Office Action," issued in connection with Application No. 2,774,009, Jul. 3, 2015, 4 pages.

* cited by examiner

METHODS OF FABRICATING SHIMS FOR JOINING PARTS

RELATED APPLICATIONS

This patent arises from a continuation of U.S. patent application Ser. No. 13/156,101, filed Jun. 8, 2011. The entirety of U.S. patent application Ser. No. 13/156,101 is incorporated by reference herein.

TECHNICAL FIELD

The present disclosure generally relates to techniques for fitting and assembling parts together within desired tolerances, and deals more particularly with a method of designing and fabricating shims used to fill gaps between part interfaces.

BACKGROUND

The parts of an assembly are sometimes required to be joined together with an accuracy that is within a preselected tolerance. For example, in the aerospace industry, some parts may be required to be assembled together with less than a 0.005 inch gap between them. When the gap exceeds the preselected tolerance, a shim or similar filler may be inserted into the gap in order to assure a within tolerance fit between the parts. The process of assembling and fitting parts together with the required accuracy may become more challenging when the assembly process must be carried out within confined spaces.

Several known methods have been used for measuring and filling part gaps during the assembly process. According to one method, a set of feeler gauges is used in a progressive trial-and-error process to measure the gap between two interfacing part surfaces. This approach is both time consuming and its accuracy may be dependent on the skill of the technician making the measurements. Using the manual gap measurements, a custom shim is constructed either manually or using automated machine tool processes.

A second method of measuring and fitting gaps between parts relies on manual probing of the gap using an electronic feeler gauge. Electronic feeler gauges may be difficult to use and the measurement results may also be dependent on the skill of the technician who carries out the measurements.

A third method of measuring and filling gaps between parts involves filling the gap with a plastic slurry material that cures in place to form a solid filler object. This solution to the problem may have several disadvantages in some applications. For example, the plastic slurry material must remain frozen until just before use and must be bonded to one of the parts but not to the opposite part. The parts to which the slurry material is to be bonded must be coated with a release agent in advance of application. In addition, the slurry material may exert a hydraulic pressure on the parts during the application process, which may deform or displace the parts slightly, reducing assembly accuracy. Another disadvantage of the slurry material is that the material may shrink in a non-uniform manner during curing. Also, the application of the material is time critical, and material may require an extended period in which to cure during which further work on the assembly may not be performed.

Still another method of filling the gaps between mating parts, sometimes referred to as predictive shimming, involves scanning the interfacing part surfaces in an attempt to predict the exact shape of the gap or void between these surfaces. The parts of the assembly are virtually fitted together and a shim is fabricated based on the virtually predicted relationship between the parts. The problem with this approach, however, is that the parts of the assembly, especially large assemblies, may experience significant relative movement of the parts between the time the parts are initially scanned and the time of assembly, resulting in changes of the shape and/or dimensions of the gap. Another disadvantage of this method lies in its dependence on relatively high global accuracy of measurement and assembly.

SUMMARY

Disclosed example methods of fabricating shims for joining parts, wherein the parts having mating surfaces separated by a gap, comprise: generating first digital data representing a first surface profile of a first part; generating second digital data representing a second surface profile of a second part to mate with the first part; determining distances between the first and second parts, as assembled, at multiple locations; generating a digital volume that closely matches a gap between the first and second parts based on the determined distances; generating a three dimensional digital representation of a shim to fill the gap using the first and second digital data; and automatically fabricating the shim matching the gap using a computer-controlled machine, the machine being controlled using the three dimensional digital representation of the shim.

Other disclosed example methods of fabricating shims for joining parts, wherein the parts have mating surfaces separated by a gap, comprise: generating first digital data representing a first surface profile of a first part; generating second digital data representing a second surface profile of a second part to mate with the first part; physically assembling the first and second parts into an assembly; placing a non-contact distance measurement device between the assembled first and second parts; measuring distances between the assembled first and second parts at multiple locations; generating a digital volume that substantially matches a gap between the first and second parts based on the measured distances; disassembling the first and second parts; generating a three dimensional digital representation of a shim to fill the gap by using the first and second digital data to map the first and second surface profiles onto the digital volume; automatically fabricating the shim matching the gap using a computer-controlled machine, the machine being controlled using the three dimensional digital representation of the shim; physically reassembling the first and second parts; and placing the fabricated shim between the parts to fill the gap.

Other features, benefits and advantages of the disclosed embodiments will become apparent from the following description of embodiments, when viewed in accordance with the attached drawings and appended claims.

BRIEF DESCRIPTION OF THE ILLUSTRATIONS

DETAILED DESCRIPTION

Figure 1:
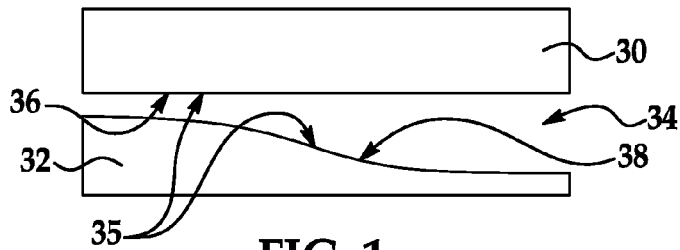
FIG. 1 is an illustration of a cross sectional view of an assembly of two parts having a gap therebetween.

Referring to FIG. 1, first and second parts 30, 32 are to be joined together with a part fit-up that is within a desired tolerance. The parts 30, 32 have opposing, interface surfaces 36, 38 respectively, which are to be joined together at a joining interface 35. Because the interface surfaces 36, 38 may not perfectly join each other along the interface 35, a gap or void 34 may be present between the part interface surfaces 36, 38.

Figure 2:
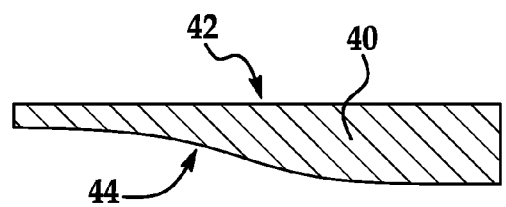
FIG. 2 is an illustration of a cross sectional view of a shim for filling the gap between the parts shown in FIG. 1.

In accordance with the disclosed embodiments, a method is provided of producing a shim 30 shown in FIG. 2 that is designed and manufactured to substantially completely fill the gap 34 between the parts 30, 32 at the interface 35. As used herein the term "shim" is intended to include, without limitation, joining parts, fillers and other elements that are used to fill one or more gaps or voids between two or more parts being assembled to achieve a fit of a prescribed tolerance. In some applications, the shim 40 may comprise one of the parts of an assembly of parts. In the present example, the shim 40 has an upper flat surface 42 substantially matching surface 36 of part 30, while the lower surface 34 of the shim 40 is contoured to match the contoured surface 38 of part 32. As will become apparent later however, the surfaces of the shim 40 that interface with the parts 30, 32 may have any shape or contour that substantially matches that of the parts 30, 32.

Figure 3:
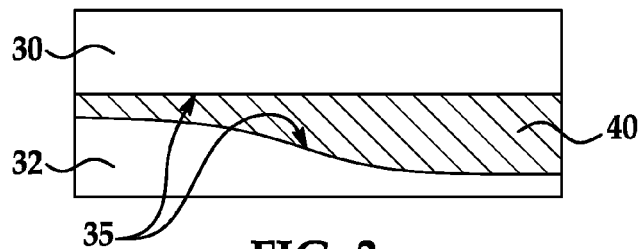
FIG. 3 is an illustration similar to FIG. 1, but showing the shim of FIG. 2 having been installed between the parts.

FIG. 3 illustrates the shim 40 of FIG. 2 having been installed in the gap 34 so as to substantially completely fill the gap 34 and thereby join the two parts 30, 32 together at the joining interface 35.

It may be useful here to define several terms that used from time to time in the present description. The term "independent surface" is used herein is intended to mean a digital surface that stands alone in definition and is free from all constraints to other digital surfaces. "Semi-independent surface" refers to a digital surface that shares some constraints with other surfaces that have been determined to have sufficient accuracy to meet prescribed tolerances. "Joining interface" as used herein, is intended to refer to a collection of two or more surfaces on one or more parts that are to be joined into an assembly or part by means of custom formation of one or more of the surfaces or by means of a shim or joining part. "Unconstrained datasets" refer to a collection of independent surfaces, points or other digital data that will be used to create a digital shim or a digital joining part. "Partially constrained datasets" refers to a collection of semi-independent surfaces, independent surfaces, points and/or other digital data that may be used to create a digital shim or digital joining part. "Digital joining part" refers to a part on which digital surfaces are defined such that they may contact themselves or other parts in multiple places in a manner that each interface has a fit of a prescribed tolerance. "Shim" and "digital shim" refer to a digital defined shim or part that is composed of independent digital surfaces, points, or other digital data that has been related or constrained to one another to create the bounds of a volume to which a physical shim may be manufactured.

Figure 4:
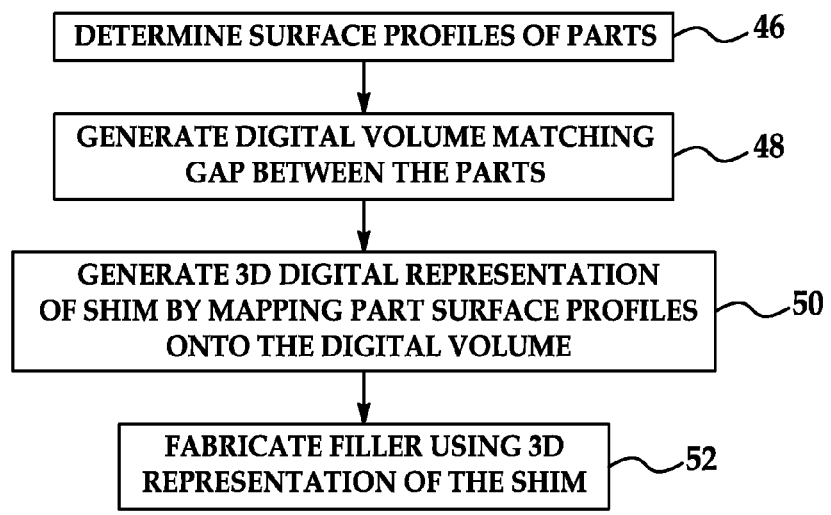
FIG. 4 is an illustration of a flow diagram broadly showing the steps of a method of fabricating a shim according to the disclosed embodiments.

Attention is now directed to FIG. 4 which broadly illustrates the steps of a method of producing a shim 40 (FIG. 3) for fitting one or more parts 30, 32 together according to the disclosed embodiments. Beginning at 46, the surface profile of the mating surfaces of two or more parts are determined. For example, the surface profiles of interface surfaces 36, 38 of parts 30, 32 shown in FIG. 1 are determined. These surface profiles may be determined using any of various techniques, such as by calling up pre-existing 3-D CAD (computer aided design) design files that digitally define the surfaces 36, 38, or by digitally scanning the surfaces 36, 38 either before or after the parts 30, 32 have been assembled, using a laser scanner, computer controlled coordinate measuring machine or other suitable equipment (all not shown). Next, at step 48 a three dimensional (3-D) digital volume is generated that substantially matches the gap 34 between parts 30, 32 (see FIG. 1). The digital volume generated in step 48 establishes a basic inner volume definition of a shim object which would closely fill the gap 34. At step 50, a 3-D digital representation of the shim 40 is generated by mapping the part surface profiles obtained in step 46 onto the digital volume generated at step 48. The results of step 50 is a digital solid definition of a shim 30 which would substantially fill the gap 34. At step 52 the 3-D representation of the shim generated in step 50 is used to fabricate the shim 40 using any of various process, such as, without limitation, computer controlled machining.

Figure 5:
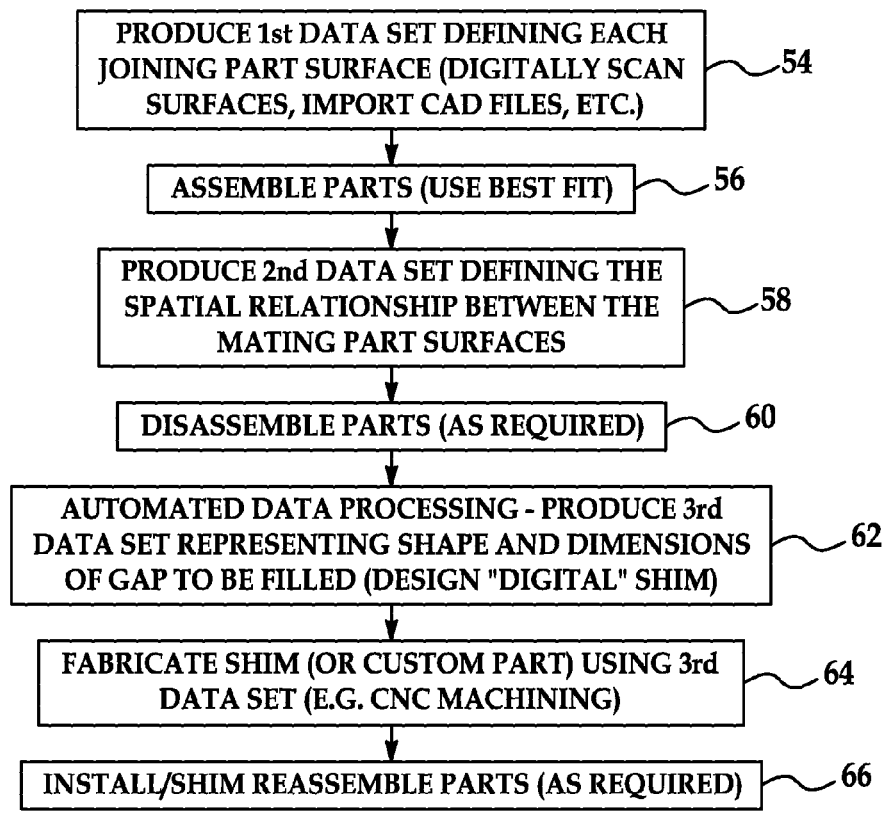
FIG. 5 is an illustration of a flow diagram showing additional detail of the method shown in FIG. 4.

Attention is now directed to FIG. 5 which illustrates additional details of an embodiment for carrying out the method shown in FIG. 4. Beginning at step 54, a first digital dataset is produced which defines each joining part surface such as surfaces 36, 38 of the parts 30, 32 shown in FIG. 2. The first digital dataset may be produced by digitally scanning the interface surfaces 36, 38 using any of various techniques, including, for example and without limitation, a computer controlled CMM (coordinate measuring machine), laser scanner, etc. Alternatively, digital files representing the interface surfaces 36, 38 may be imported from an existing source, such as one or more CAD design files that define the surfaces 36, 38 in 3-D.

At step 56, the parts 30, 32 are assembled on a best-fit basis. The dataset produced in step 54 may be produced either before or after the parts 30, 32 are assembled in step 56. At step 58 a second digital dataset is produced which defines the 3-D spatial relationship between the part interface surfaces 36, 38. The second digital data set may be produced using any of various techniques which establish the relative positions of the interface surfaces 36, 38 in 3-D space. For example, following assembly of the parts 30, 32 in step 56, a laser scanner (not shown) may be inserted into the gap 34 and used to scan the surfaces 36, 38. This scanning process generates digital data representing the distance between the surfaces 36, 38 at a multitude of points representing the digital volume matching the gap previously discussed in connection with step 48 in FIG. 4.

Next, at 60, the parts 30, 32 may be disassembled, as required, although in some applications the parts 30, 32 may remain in their assembled state until a shim 40 has been fabricated and inserted into the gap 34 between the parts 30, 32. At step 62, automated data processing implemented by a computer (not shown) may be used to produce a third data set that represents the shape and dimensions of the gap 34 to be filled. Step 62 is similar to step 50 shown in FIG. 4 in which a 3-D representation of the shim 40 is generated corresponding to the shape and dimensions of the gap 34. At step 64, a shim or similar custom part is fabricated using the third dataset produced at step 62. The shim 40 may be fabricated, for example and without limitation, using CNC machining. Finally, as shown in 66, the shim 40 may be inserted into the gap 34 between the assembled parts 30, 32, although if the parts 30, 32 have been previously disassembled at step 60, then the parts 30, 32 are reassembled with the shim 40 inserted into the gap 34.

The disclosed method may be employed to assemble and fit a wide variety of parts having differing shapes and interface surface contours. For example, the method may be used to assemble and fit parts having parallel joining interfaces, constant radius of curvature joining interfaces, orthogonal joining interfaces, and others (all not shown). Constraint relationships required to establish the relationship between joining surfaces may be established using any of a variety of techniques, including mechanically or electronically measuring the distance between the joining surfaces at multiple locations on the part surfaces 36, 38.

Figures 6, 7:
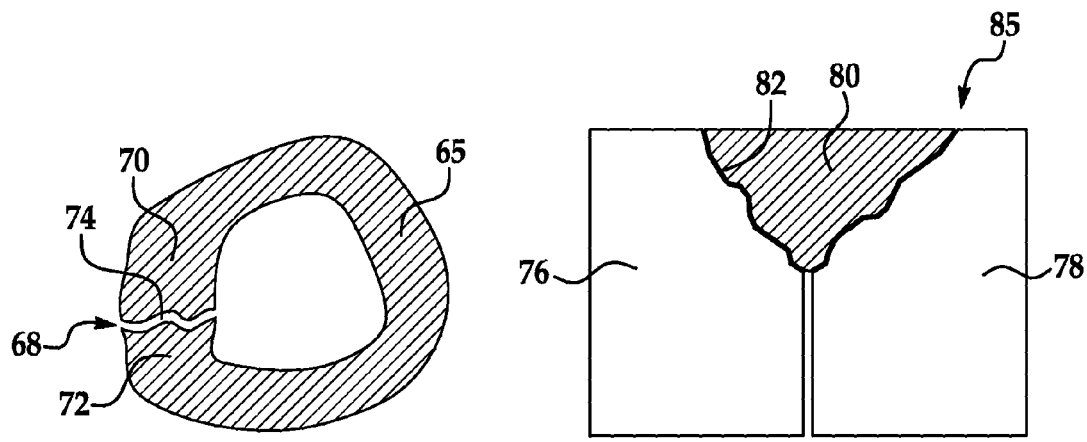
FIG. 6 is an illustration of a cross sectional view of a part that joins itself.
FIG. 7 is an illustration of a cross sectional view of two parts that are joined to a third part using the disclosed method.

FIG. 6 illustrates a single part 65 having opposing portions 70, 72 separated by a gap 68. The disclosed method may be used to fabricate a shim 74 that substantially matches the shape of the gap 68 and results in fitting of the two portions 70, 72 together within a desired tolerance.

Referring to FIG. 7, the disclosed method may be employed to fabricate a joining part 80 which joins two other parts 76, 78 together, wherein the joining part 80 forms part of a part assembly 85. In this example, parts 76 and 78 are joined along a joining interface 82 to which the joining part 80 conforms.

Figure 8:
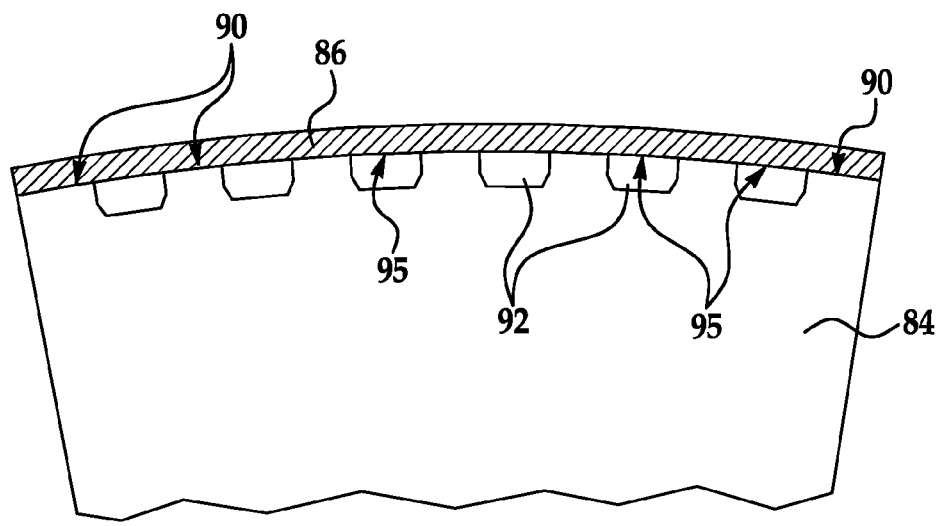
FIG. 8 is an illustration of a cross sectional view of two parts requiring the use of multiple shims.

FIG. 8 illustrates an assembly of two parts 84, 86 representing a partially constrained dataset, and respectively having interface surfaces 90, 95. Part 84 includes grooves 92 that define seven semi-independent interface surfaces 90, while part 86 has a single independent surface 95. In order to fit the interfacing and surfaces 90, 95 within desired tolerances, the disclosed method may be employed to fabricate seven shims (not shown in FIG. 8) which are placed between surfaces 90, 95 to fill any gaps that may be present therebetween.

Figure 9:
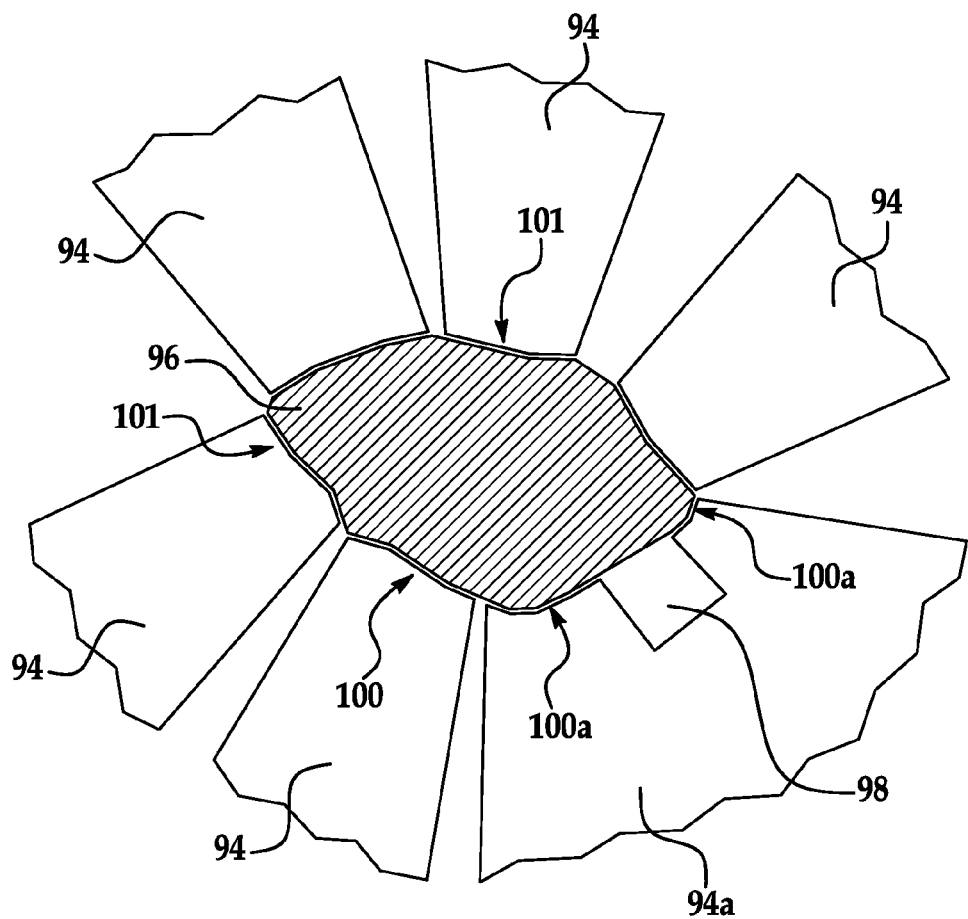
FIG. 9 is an illustration of a cross sectional view of a shim used to join together multiple parts.

FIG. 9 illustrates a joining part 96 fabricated according to the disclosed method that may be employed to join multiple other parts 94 along differing interface surfaces 101. A groove 98 through part 94a results in part 94a having two independent surfaces 100a fitted to the joining part 96, while the other parts 94 have only one independent surface 101 fitted to the joining part 94.

Figure 10:
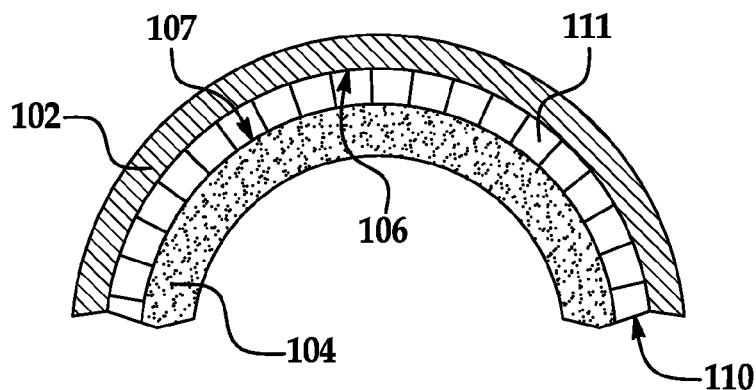
FIG. 10 is an illustration of a cross sectional view of two curved parts having substantially constant radii of curvature and having a curved gap therebetween.

FIG. 10 illustrates an assembly of parts 102, 104 which respectively near-constant radius of curvature interfacing surfaces 106, 107 are separated by a gap 110. According to the disclosed method, a shim 111 designed and fabricated by the disclosed method, has a suitable curvature and dimensions which closely fill the gap 110.

Figure 11:
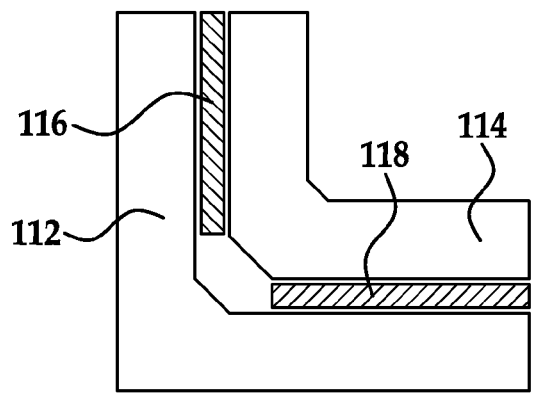
FIG. 11 is an illustration of two parts joined together by substantially orthogonal shims.

FIG. 11 illustrates an assembly of parts 112, 114 that may be joined together by substantially orthogonal shims 116, 118 designed and fabricated in accordance with the disclosed method.

Figure 12:
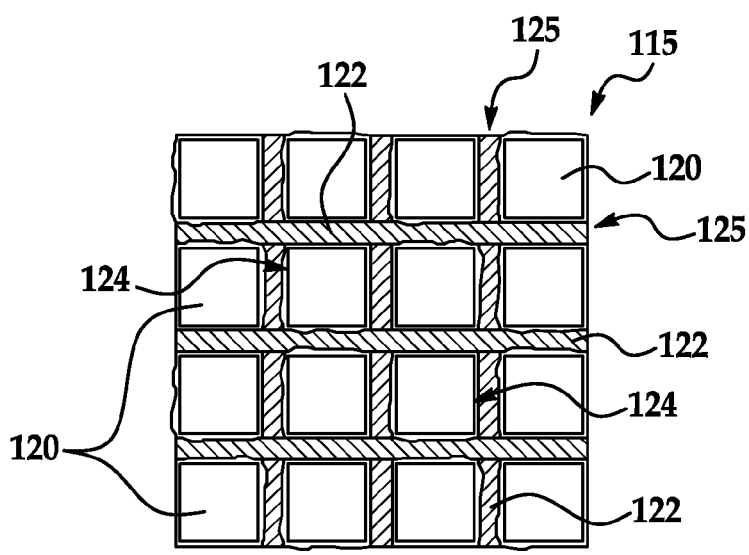
FIG. 12 is an illustration of a cross sectional view showing multiple parts having various part joining interfaces joined together by individual shims.

FIG. 12 illustrates an assembly 115 of sixteen generally square parts 120 fitted together by shims 122 produced in accordance with the disclosed method. In this example, each of the parts 120 may have regular or irregular interface surfaces 124 forming gaps 125 filled by segmented shims 122. There may be no theoretical limit to the number of parts 120 or the size of the overall assembly 115 that may be fitted using the disclosed method using locally accurate shimming. Geometric changes within the assembly 115 may usually occur over a broad area. According to the disclosed method, segmented shims 122 may be used that are small enough that geometry changes in the assembly 115 due to warpage or the like do not shift the shims 122 out of tolerance.

Figure 13:
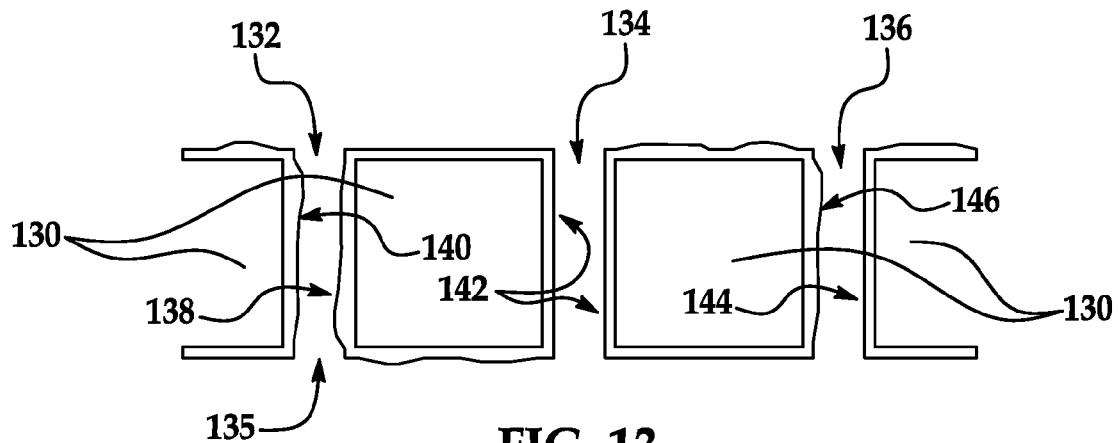
FIG. 13 is an illustration showing details of several of the part interfaces shown in FIG. 12.

FIG. 13 illustrates four generally square parts 130, similar to those shown in FIG. 12, which have generally parallel interface surfaces 138, 140, 142, 144, 146, some of which however, may include uneven surface contours, e.g. 140, 146. The technique used to establish reference points at the interface surfaces 138-146 will vary depending upon the complexity of the contour of interface surface 138-146. For example, the part interface shown at 132 comprises two complex contoured surfaces 138, 140. In this case, both surfaces 138, 140 are referenced laterally with respect to each other, and surface reference points on both surfaces 138, 140 are therefore used for gap measurement. One technique for accomplishing this referencing is to tie the two adjacent parts 130 together using common features such as three common holes (not shown) in the parts 130. Another technique would be to measure lateral differences between reference features and the assembled parts as well as the gap 135 between the surfaces 138, 140.

At the surface interface shown at 134, the opposing interface surfaces 142 are generally smooth and parallel, consequently, in order to establish the relationship between the opposing interface surfaces 142, gap measurements need only be measured at three points on either of the surfaces 142. Finally, as shown at part 136, one of the interface surfaces 146 is relatively highly contoured, while the other opposing interface surface 144 is relatively smooth. In this case, the reference points for gap measurement need be placed only on the contoured surface 146.

Figure 14:
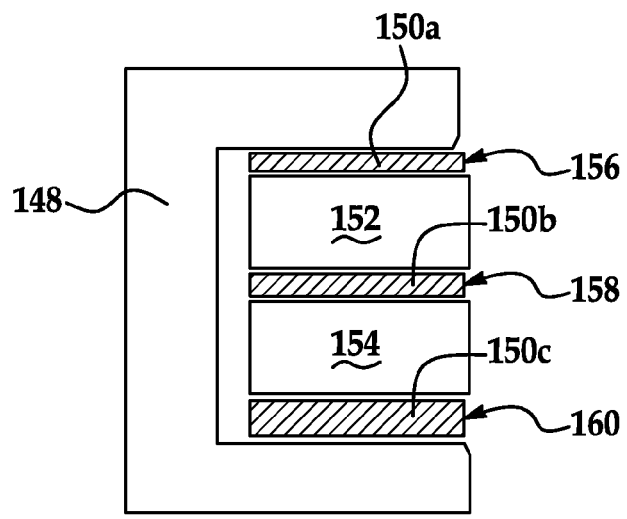
FIG. 14 is an illustration of a cross sectional view showing multiple part interfaces between trapped parts.

FIG. 14 illustrates trapped joining interfaces 156, 158, 160 between mating parts 152, 154 that are trapped within a common base part 148. Thus, the two mating parts 152, 154 are constrained at both ends by the stack-up of the common part 148. In this example, it is desirable to produce shims 150a, 150c and then perform the necessary measurements and fabrication steps to produce the third shim 150b.

Figure 15:
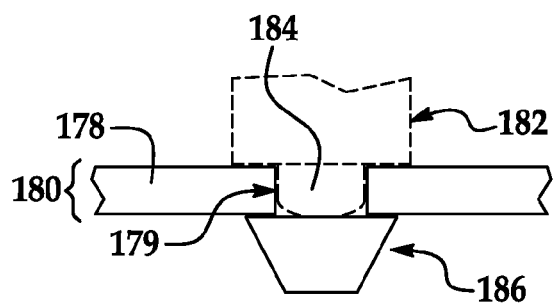
FIG. 15 is an illustration of a cross sectional view of a part whose thickness is being measured.
Figure 16:
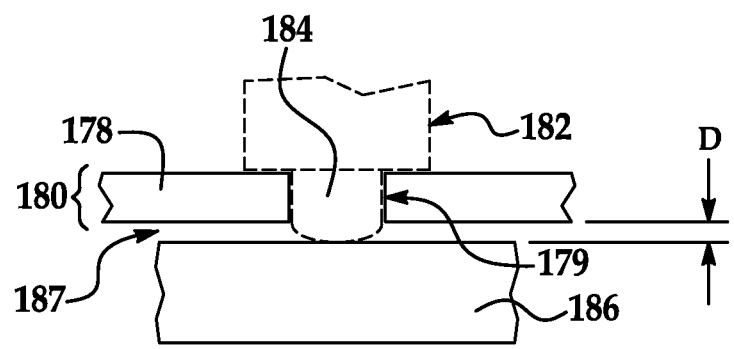
FIG. 16 is an illustration of a cross sectional view showing the part in FIG. 15 having been assembled with a second part, wherein a gap between the two parts is being measured.

As previously discussed, a variety of techniques can be employed to establish the relationship between two parts 30, 32 (FIG. 1) for the purposes of calculating a solid volume that will fill a gap 34 between the parts 30, 32. For example, FIGS. 15 and 16 illustrate a technique for measuring gaps between two parts 178, 186 (FIG. 16) which have one or more holes 179. In this example, part 178 may comprise an aircraft skin 178 having one or more holes 179 at known locations forming reference points on the skin 178. As shown in FIG. 15, in order to first determine the thickness 180 of the skin 178, the tip 184 of a depth probe 182 is inserted into the hole 179 and is brought into contact with a backing disk 186, following which the thickness 180 of the skin 178 may be measured. Then, as shown in FIG. 16, a second part 186 is assembled onto the skin 180, which may result in a gap 187 between the skin 178 and the part 186. The tip 184 of the depth probe 182 is then reinserted into the hole 184 until it comes into contact with the part 186, allowing a measurement of the distance "D" between the two parts 178, 186 at the location of the hole 179. Using similar techniques, it may be possible to measure gap distances between more than two stacked parts.

Figure 17:
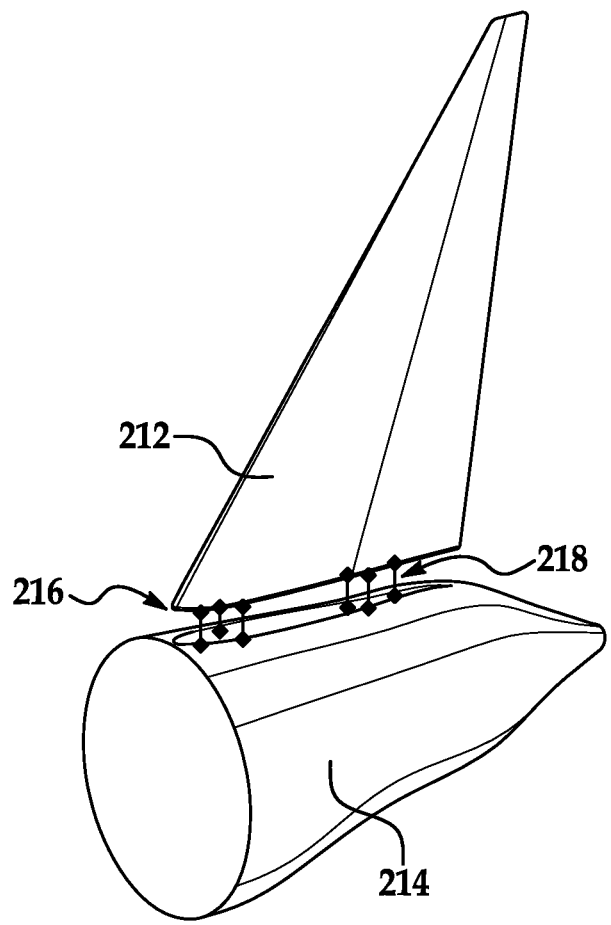
FIG. 17 is an illustration of gap measurements between a vertical tail stabilizer and the fuselage of an aircraft.

FIG. 17 illustrates the assembly of a vertical tail stabilizer 212 on a fuselage 214 of an aircraft using the disclosed method. The vertical stabilizer 212 is brought into close proximity and held in position immediately above the fuselage 214. Three gap measurements are then performed at both the front 216 and the rear 218 of the assembly thereby establishing the spatial relationship between the stabilizer 212 and the fuselage 214. Based upon these gap measurements which establish the spatial relationship between the stabilizer 212 and the fuselage 214 and the surface profiles of these two parts, one or more suitable shims (not shown in FIG. 16) may be fabricated to achieve a fit between the stabilizer 212 and the fuselage 214 within desired tolerances.

Figure 18:
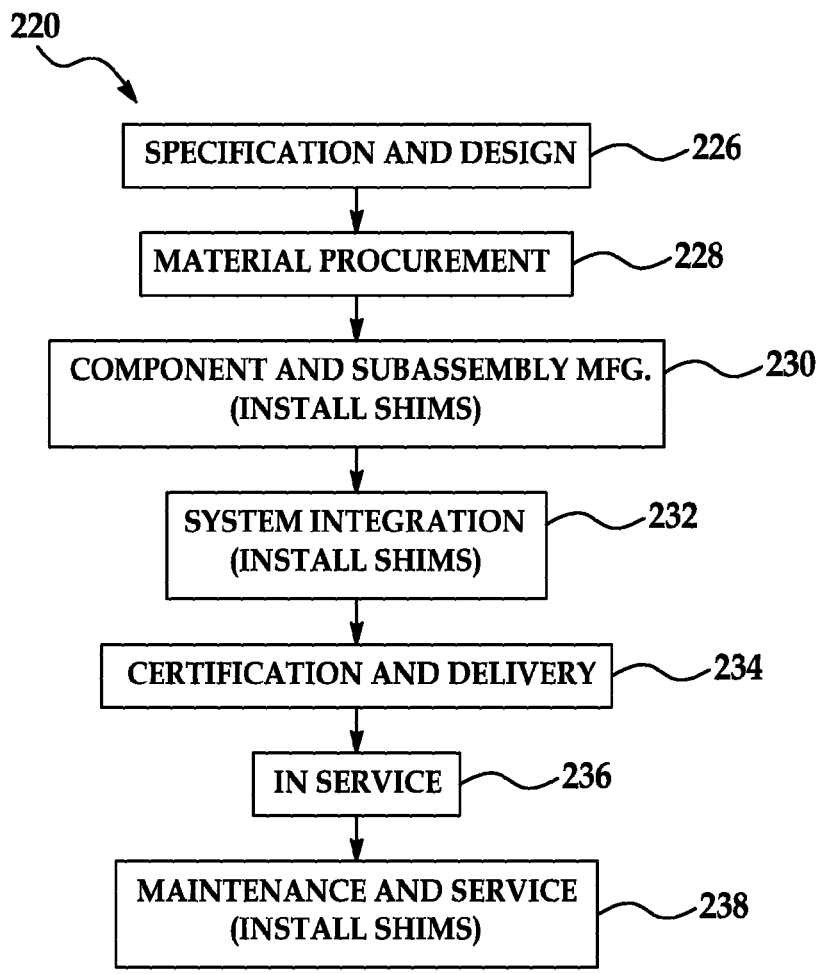
FIG. 18 is an illustration of a flow diagram of aircraft production and service methodology.
Figure 19:
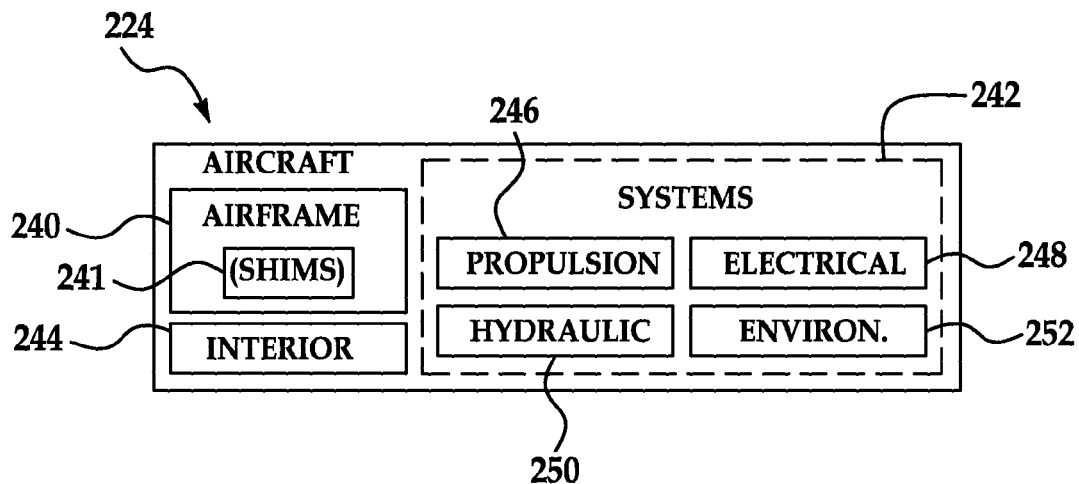
FIG. 19 is an illustration of a block diagram of an aircraft.

Embodiments of the disclosure may find use in a variety of potential applications, particularly in the transportation industry, including for example, aerospace, marine and automotive applications. Thus, referring now to FIGS. 18 and 19, embodiments of the disclosure may be used in the context of an aircraft manufacturing and service method 220 as shown in FIG. 18 and an aircraft 224 as shown in FIG. 19. Aircraft applications of the disclosed embodiments may include, for example, without limitation, assembly and fitting fuselage skins, wings and wing skins, stiffeners, control surfaces, hatches, floor panels, door panels, access panels and empennages, to name a few. During pre-production, exemplary method 220 may include specification and design 226 of the aircraft 224 and material procurement 228. During production, component and subassembly manufacturing 230 and system integration 232 of the aircraft 224 takes place. Thereafter, the aircraft 224 may go through certification and delivery 234 in order to be placed in service 236. While in service by a customer, the aircraft 224 is scheduled for routine maintenance and service 238 (which may also include modification, reconfiguration, refurbishment, and so on). During any of stages 230, 232 and 238, shims produced according to the disclosed method may be used to join parts, components or assemblies of the aircraft 224.

Each of the processes of method 220 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 19, the aircraft 224 produced by exemplary method 220 may include an airframe 240 with a plurality of systems 242 and an interior 244. Examples of high-level systems 242 include one or more of a propulsion system 248, an electrical system 248, a hydraulic system 250, and an environmental system 252. Any number of other systems may be included. Although an aerospace example is shown, the principles of the disclosure may be applied to other industries, such as the marine and automotive industries. The disclosed embodiments may be used to produce shims 241 that are employed to fit and join various parts, components and subassemblies of the airframe 240.

Systems and methods embodied herein may be employed during any one or more of the stages of the production and service method 220. For example, components or subassemblies corresponding to production process 230 may be fabricated or manufactured in a manner similar to components or subassemblies produced while the aircraft 224 is in service. Also, one or more apparatus embodiments, method embodiments, or a combination thereof may be utilized during the production stages 230 and 232, for example, by substantially expediting assembly of or reducing the cost of an aircraft 224. Similarly, one or more of apparatus embodiments, method embodiments, or a combination thereof may be utilized while the aircraft 224 is in service, for example and without limitation, to maintenance and service 238.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A method of fabricating shims for joining parts, wherein the parts having mating surfaces separated by a gap, comprising:
   generating first digital data representing a first surface profile of a first part;
   generating second digital data representing a second surface profile of a second part to mate with the first part;
   determining distances between the first and second parts, as assembled, at multiple locations;
   generating a digital volume that closely matches a gap between the first and second parts based on the determined distances;
   generating a three dimensional digital representation of a shim to fill the gap using the first and second digital data; and
   automatically fabricating the shim matching the gap using a computer-controlled machine, the machine being controlled using the three dimensional digital representation of the shim.

2. A method as defined in claim 1, wherein determining the distances between the first and second parts as assembled comprises determining the distances between the first and second parts when the first and second parts are physically assembled.

3. A method as defined in claim 1, wherein generating the three dimensional digital representation of the shim comprises mapping the first and second surface profiles onto the digital volume.

4. A method as defined in claim 1, wherein generating the first digital data comprises digitally scanning surfaces of the first part.

5. A method as defined in claim 4, wherein generating the second digital data comprises digitally scanning surfaces of the second part.

6. A method as defined in claim 4, wherein digitally scanning surfaces of the first part comprises using a laser scanner.

7. A method as defined in claim 1, wherein automatically fabricating the shim comprises using computer-controlled machining.

8. A method as defined in claim 1, wherein generating the digital volume comprises establishing relative positions of a first interface surface having the first surface profile and a second interface surface having the second surface profile.

9. A method as defined in claim 1, wherein the gap is defined by three or more parts including the first and second parts, and generating the digital volume comprises determining contours of the digital volume defined by the three or more parts.

10. A method as defined in claim 1, wherein generating the digital volume comprises using respective surface reference points present on the first and second parts.

11. A method of fabricating shims for joining parts, wherein the parts have mating surfaces separated by a gap, comprising:
generating first digital data representing a first surface profile of a first part;
generating second digital data representing a second surface profile of a second part to mate with the first part;
physically assembling the first and second parts into an assembly;
placing a non-contact distance measurement device between the assembled first and second parts;
measuring distances between the assembled first and second parts at multiple locations;
generating a digital volume that substantially matches a gap between the first and second parts based on the measured distances;
disassembling the first and second parts;
generating a three dimensional digital representation of a shim to fill the gap by using the first and second digital data to map the first and second surface profiles onto the digital volume;
automatically fabricating the shim matching the gap using a computer-controlled machine, the machine being controlled using the three dimensional digital representation of the shim;
physically reassembling the first and second parts; and
placing the fabricated shim between the parts to fill the gap.

12. A method as defined in claim 11, wherein measuring the distances between the assembled first and second parts is performed at at least three points.

13. A method as defined in claim 11, wherein measuring the distances between the assembled first and second parts comprises using a computer-controlled coordinate measuring machine or a laser scanner.

14. A method as defined in claim 11, wherein automatically fabricating the shim comprises using computer-controlled machining.

15. A method as defined in claim 11, wherein physically assembling the first and second parts into the assembly comprises assembling the first and second parts on a best-fit basis.

16. A method as defined in claim 11, wherein generating the first digital data comprises digitally scanning surfaces of the first part.

17. A method as defined in claim 16, wherein generating the second digital data comprises digitally scanning surfaces of the second part.

18. A method as defined in claim 16, wherein digitally scanning surfaces of the first part comprises using a laser scanner.

19. A method as defined in claim 11, wherein generating the first digital data comprises loading first computer aided design data that defines surfaces of the first part.

20. A method as defined in claim 19, wherein generating the second digital data comprises loading second computer aided design data that defines surfaces of the second part.

* * * * *